United States Patent
Bash et al.

(10) Patent No.: US 7,072,739 B2
(45) Date of Patent: Jul. 4, 2006

(54) DATA CENTER ROBOTIC DEVICE

(75) Inventors: Cullen E. Bash, San Francisco, CA (US); Abdlmonem H. Beitelmal, Los Altos, CA (US); Keith Farkas, San Carlos, CA (US); Chandrakant D. Patel, Fremont, CA (US); Parthasarathy Ranganathan, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 224 days.

(21) Appl. No.: 10/446,867

(22) Filed: May 29, 2003

(65) Prior Publication Data

US 2004/0243280 A1    Dec. 2, 2004

(51) Int. Cl.
*G06F 19/00* (2006.01)
(52) U.S. Cl. ............ 700/245; 700/248; 700/249; 700/255; 700/259; 901/3; 901/46; 901/47; 701/301

(58) Field of Classification Search ............... 700/245, 700/258, 248–249, 251–252, 255, 259; 701/28, 701/301; 901/3, 46–47
See application file for complete search history.

(56) References Cited

U.S. PATENT DOCUMENTS

| | | | | |
|---|---|---|---|---|
| 5,237,468 | A * | 8/1993 | Ellis .............................. | 360/92 |
| 5,497,057 | A * | 3/1996 | Danielson et al. ........... | 318/371 |
| 5,980,194 | A * | 11/1999 | Freerks et al. .............. | 414/754 |
| 2002/0161480 | A1* | 10/2002 | Kakutani et al. ........... | 700/245 |
| 2003/0207243 | A1* | 11/2003 | Shen et al. .................. | 434/322 |
| 2004/0130442 | A1* | 7/2004 | Breed et al. ................. | 340/443 |
| 2005/0024826 | A1* | 2/2005 | Bash et al. .................. | 361/695 |
| 2005/0038562 | A1* | 2/2005 | Bash et al. .................. | 700/245 |

* cited by examiner

*Primary Examiner*—Thomas G. Black
*Assistant Examiner*—McDieunel Marc
(74) *Attorney, Agent, or Firm*—Richard P. Lange

(57) ABSTRACT

A method for operating a data center with a robotic device. In the method, a condition is detected in a location of the data center. The robotic device, which includes a camera and a manipulator, is maneuvered to travel to the location of the data center. The location of the data center is imaged with the camera of the robotic device and an object is manipulated with the manipulator of the robotic device.

41 Claims, 6 Drawing Sheets

DATA CENTER ROBOTIC DEVICE

BACKGROUND OF THE INVENTION

A data center may be defined as a location, e.g., room, that houses computer systems arranged in a number of racks. A standard rack, e.g., electronics cabinet, is defined as an Electronics Industry Association (EIA) enclosure, 78 in. (2 meters) wide, 24 in. (0.61 meter) wide and 30 in. (0.76 meter) deep. These racks are configured to house a number of computer systems, e.g., about forty (40) systems, with future configurations of racks being designed to accommodate up to eighty (80) systems. The computer systems typically include a number of components, e.g., one or more of printed circuit boards (PCBs), mass storage devices, power supplies, processors, micro-controllers, semi-conductor devices, and the like, that may dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

Conventional data centers may include hundreds, if not thousands, of racks containing thousands of systems and subsystems. In addition, the racks may be housed in a space comprising 10,000 sq. ft. or more. Due to the size and space necessary for computing requirements in the data centers, the amount of time and expense in performing day-to-day operations by personnel in the data centers is substantial.

SUMMARY OF THE INVENTION

According to an embodiment, the present invention pertains to a method for operating a data center with a robotic device. In the method, a condition is detected in a location of the data center. The robotic device, which includes a camera and a manipulator, is maneuvered to travel to the location of the data center. The location of the data center is imaged with the camera of the robotic device and an object is manipulated with the manipulator of the robotic device.

According to another embodiment, the invention relates to a method for operating a data center with a robotic device. In the method, a route for the robotic device to travel in the data center is plotted. The robotic device is maneuvered to travel along the plotted route and the one or more conditions in the data center is detected with the robotic device. It is determined whether the one or more conditions in the data center are within respective norms. In addition, the one or more objects are manipulated in response to the one or more conditions being outside the respective norms.

According to a further embodiment, the present invention relates to a robotic device for performing operations in a data center. The robotic device includes a body having a plurality of wheels and a steering and propelling mechanism located on the body to control rotation and direction of the plurality of wheels. The robotic device also includes an arm assembly rotatably attached to the body and a manipulator assembly rotatably attached to a free end of the arm assembly. A plurality of actuators are provided for manipulating the arm assembly and the manipulator assembly. A controller is configured to control the plurality of actuators to manipulate the arm assembly and the manipulator assembly into various positions. In addition, the controller is further configured to operate the plurality of actuators to perform operations in the data center.

According to yet another embodiment, the invention relates to a system for operating a data center with a robotic device. The system includes means for detecting one or more conditions in the data center; means for determining whether the one or more conditions are within respective norms; means for determining one or more manipulations to objects to bring the one or more conditions to within the respective norms; and means for manipulating the objects with the robotic device.

According to yet another embodiment, the invention relates to a computer readable storage medium on which is embedded one or more computer programs. The one or more computer programs are configured to implement a method for operating a data center with a robotic device. The one or more computer programs include a set of instructions for: detecting a condition in a location of the data center; maneuvering the robotic device to travel to the location of the data center, wherein the robotic device comprises a camera and a manipulator; imaging the location of the data center with the camera of the robotic device; and manipulating an object with the manipulator of the robotic device.

BRIEF DESCRIPTION OF THE DRAWINGS

Features of the present invention will become apparent to those skilled in the art from the following description with reference to the figures, in which.

DETAILED DESCRIPTION OF THE INVENTION

Figure 1:
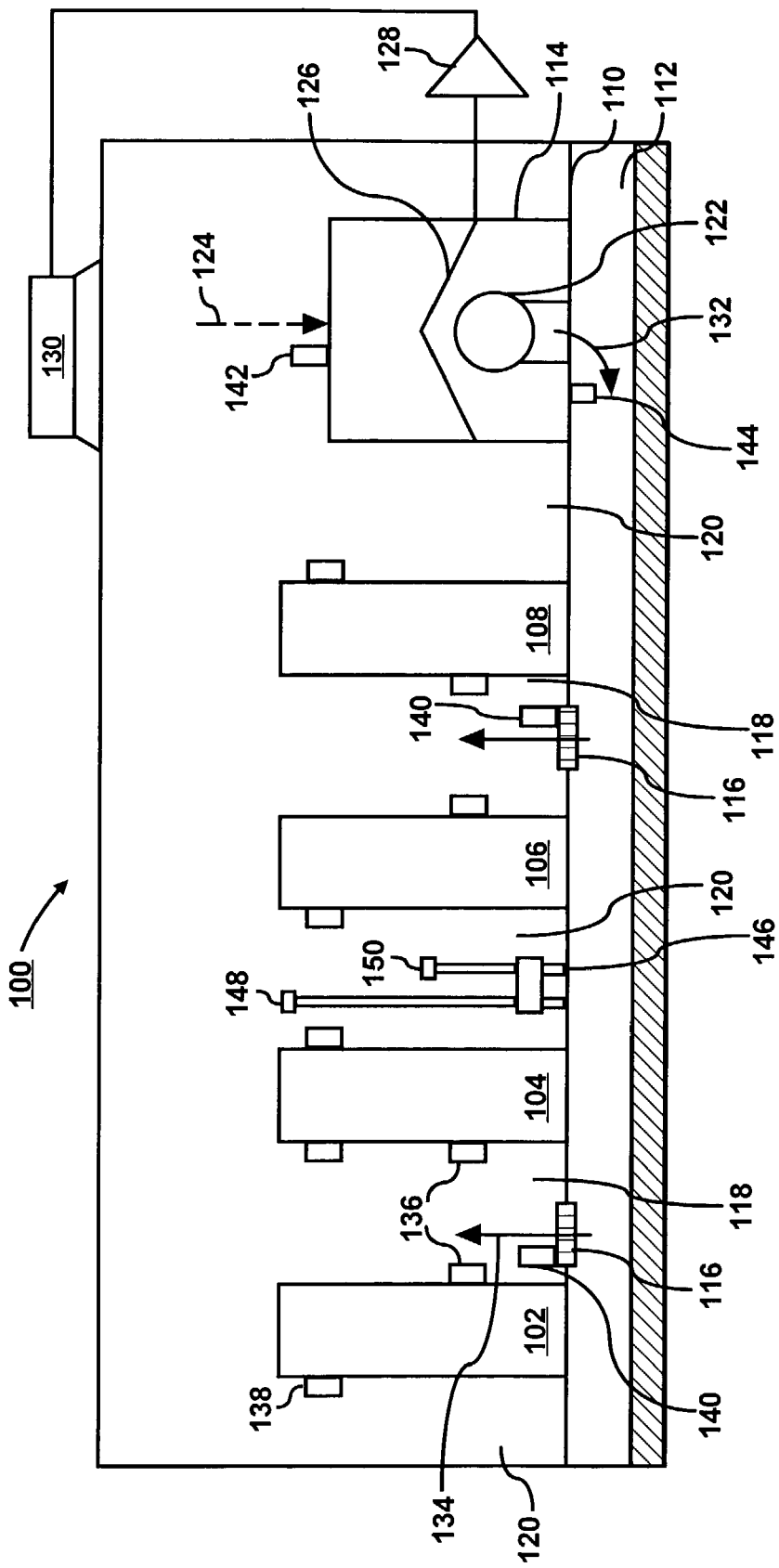
FIG. 1 shows a simplified illustration of a side elevational view of a data center according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Throughout the present disclosure, reference is made to "cooling fluid" and "heated air". For purposes of simplicity, "cooling fluid" may generally be defined as air that has been cooled by a cooling device, e.g., an air conditioning unit. In addition, "heated air" may generally be defined as air, or cooling fluid, that has been heated, e.g., cooling fluid, that has received heat from a heat generating/dissipating component. It should be readily apparent, however, that the terms "cooling fluid" are not intended to denote air that only contains cooled air and that "heated air" only contains air that has been heated. Instead, embodiments of the invention may operate with air that contains a mixture of heated air and cooling fluid. In addition, cooling fluid and heated air may denote gases other than air, e.g., refrigerant and other types of gases known to those of ordinary skill in the art that may be used to cool electronic components.

According to an embodiment of the invention, a robotic device is configured to travel around a data center and detect various conditions in the data center. The robotic device is also comprised of various tools configured to perform anthropomorphic functions on components or objects located in the data center. For example, the robotic device may be configured to perform various functions related to servers or other components housed in racks of the data center. In addition, the robotic device may be configured to operate various apparatus of a system designed to cool heat generating/dissipating components housed in racks or otherwise located in the data center.

With respect to performing the various anthropomorphic functions, the robotic device may comprise a grappling device. The grappling device may be used to maneuver various objects in the data center. The robotic device may also comprise a pointing device, which may form part of the grappling device. The pointing device may also be used to reposition various objects as well as to activate or deactivate various components by pushing buttons or flipping switches located on the components.

The robotic device thus described may manually operate various apparatus of a cooling system comprising one or more computer room air conditioning (CRAC) units, vents, returns, etc. By way of example, the robotic device may operate manually adjustable vents to vary the direction and/or magnitude of airflow through those vents. In addition, the robotic device may detect objects located on the vents or on the inlets of the CRAC units. According to an embodiment, the robotic device may be instructed to move the objects such that they do not impede airflow through the vents. The instruction may be received from a user or it may be in the form of software. In other embodiments, the robotic device may be implemented to intentionally impede airflow through, for example, a vent.

With reference first to FIG. 1, there is shown a simplified illustration of a side elevational view of a data center 100 according to an embodiment of the invention. The terms "data center" are generally meant to denote a room or other space where one or more components capable of generating heat maybe situated. In this respect, the terms "data center" are not meant to limit the invention to any specific type of room where data is communicated or processed, nor should it be construed that use of the terms "data center" limits the invention in any respect other than its definition hereinabove. For example, a data center may comprise a location that houses numerous printed circuit (PC) board electronic systems arranged in a number of racks.

It should be readily apparent to those of ordinary skill in the art that the data center 100 depicted in FIG. 1 represents a generalized illustration and that other components may be added or existing components may be removed or modified without departing from the scope of the invention. For example, the data center 100 may include any number of racks and various other components. In addition, it should be understood that heat generating/dissipating components may be located in the data center 100 without being housed in racks.

The data center 100 is depicted as having a plurality of racks 102–108, e.g., electronics cabinets, aligned in parallel rows. Although not visible in FIG. 1, the racks 102–108 may comprise the end racks in respective rows of racks. That is, additional racks (not shown) may be located adjacent to the racks 102–108 to form rows of racks. The racks 102–108 are positioned on a raised floor 110. A plurality of wires and communication lines (not shown) may be located in a space 112 beneath the raised floor 110. The space 112 may also function as a plenum for delivery of cooling fluid from an air conditioning unit 114 to the racks 102–108. The cooling fluid may be delivered from the space 112 to the racks 102–108 through vents 116 located between some or all of the racks 102–108. The vents 116 are shown as being located between racks 102 and 104 and 106 and 108.

The vents 116 may comprise vanes having pre-set orientations. Alternatively, the vanes may be movable to enable airflow therethrough to be directed to flow into various directions and/or magnitudes. As a further alternative, the vents 116 may comprise the dynamically controllable vents disclosed and described in commonly assigned U.S. application Ser. No. 09/970,707, filed on Oct. 5, 2001, the disclosure of which is hereby incorporated by reference in its entirety. As described in that application, the vents 116 are termed "dynamically controllable" because they generally operate to control at least one of velocity, volume flow rate and direction of the cooling fluid therethrough. The vents 116 of that application are also substantially independently controllable via receipt of environmental condition information from one or more sensors.

In addition, specific examples of dynamically controllable vents 116 may be found in U.S. application Ser. No. 10/375,003, filed on Feb. 28, 2003, which is assigned to the assignee of the present invention and is incorporated by reference herein in its entirety.

The racks 102–108 are generally configured to house a plurality of components, e.g., networking equipment, storage drives, processors, micro-controllers, high-speed video cards, memories, semi-conductor devices, and the like. The components may be elements of a plurality of subsystems (not shown), e.g., computers, servers, etc. The subsystems and the components may be implemented to perform various electronic, e.g., computing, switching, routing, displaying, and the like, functions. In the performance of these electronic functions, the components, and therefore the subsystems, may generally dissipate relatively large amounts of heat. Because the racks 102–108 have generally been known to include upwards of forty (40) or more subsystems, they may transfer substantially large amounts of heat to the cooling fluid to maintain the subsystems and the components generally within predetermined operating temperature ranges.

The subsystems, e.g., servers, typically include a device for activating/de-activating the subsystems. These devices are typically in the form of a switch or a button. In addition, these subsystems are typically wired to one another and to various other devices located in the data center. In addition, these devices may be wired to a power strip or a communication bus and often contain specific network Internet protocol (IP) addresses. As will be described in greater detail hereinbelow, these addresses may be used in determining the locations of the various subsystems in the data center.

Although the data center 100 is illustrated as containing four rows of racks 102–108 and an air conditioning unit 114, it should be understood that the data center 100 may include any number of racks, e.g., 100 racks, and air conditioning units, e.g., four or more. The depiction of four rows of racks 102–108 and an air conditioning unit 114 is for illustrative and simplicity of description purposes only and is not intended to limit the invention in any respect.

The areas between the racks 102 and 104 and between the racks 106 and 108 may comprise cool aisles 118. These aisles are considered "cool aisles" because they are configured to receive cooling fluid from the vents 116. In addition, the racks 102–108 generally receive cooling fluid from the cool aisles 118. The aisles between the racks 104 and 106, and on the rear sides of racks 102 and 108, are considered hot aisles 120. These aisles are considered "hot aisles" because they are positioned to receive air heated by the components in the racks 102–108. By substantially separating the cool aisles 118 and the hot aisles 120, e.g., with the racks 102–108, the cooling fluid may substantially be prevented from re-circulating with the heated air prior to delivery into the racks 102–108.

The sides of the racks 102–108 that face the cool aisles 118 may be considered as the fronts of the racks and the sides of the racks 102–108 that face away from the cool aisles 118 may be considered as the rears of the racks. For purposes of simplicity and not of limitation, this nomenclature will be relied upon throughout the present disclosure to describe the various sides of the racks 102–108.

According to another embodiment of the invention, the racks 102–108 may be positioned with their rear sides adjacent to one another (not shown). In this embodiment, vents 116 may be provided in each aisle 118 and 120. In addition, the racks 102–108 may comprise outlets on top panels thereof to enable heated air to flow out of the racks 102–108.

As described hereinabove, the air conditioning unit 114 receives heated air through one or more inlets and cools the heated air. In addition, the air conditioning unit 114 supplies the racks 102–108 with air that has been cooled, e.g., cooling fluid, through, for example, a process as described below. The air conditioning unit 114 generally includes a fan 122 for supplying cooling fluid (e.g., air) into the space 112 (e.g., plenum) and/or drawing air from the data center 100 (e.g., as indicated by the arrow 124). In operation, the heated air enters into the air conditioning unit 114 as indicated by the arrow 124 and is cooled by operation of a cooling coil 126, a compressor 128, and a condenser 130, in a manner generally known to those of ordinary skill in the art. In terms of cooling system efficiency, it is generally desirable that the return air is composed of the relatively warmest portion of air in the data center 100.

Although reference is made throughout the present disclosure of the use of a fan 122 to draw heated air from the data center 100, it should be understood that any other reasonably suitable manner of air removal may be implemented without departing from the scope of the invention. By way of example, a fan (not shown) separate from the fan 122 or a blower may be utilized to draw air from the data center 100.

In addition, based upon the cooling fluid needed to cool the heat loads in the racks 102–108, the air conditioning unit 114 may be operated at various levels. For example, the capacity (e.g., the amount of work exerted on the refrigerant) of the compressor 128 and/or the speed of the fan 122 may be modified to thereby control the temperature and the amount of cooling fluid flow delivered to the racks 102–108. In this respect, the compressor 128 may comprise a variable capacity compressor and the fan 122 may comprise a variable speed fan. The compressor 128 may thus be controlled to either increase or decrease the mass flow rate of a refrigerant therethrough.

Because the specific type of compressor 128 and fan 122 to be employed with embodiments of the invention may vary according to individual needs, the invention is not limited to any specific type of compressor or fan. Instead, any reasonably suitable type of compressor 128 and fan 122 that are capable of accomplishing certain aspects of the invention may be employed with the embodiments of the invention. The choice of compressor 128 and fan 122 may depend upon a plurality of factors, e.g., cooling requirements, costs, operating expenses, etc.

It should be understood by one of ordinary skill in the art that embodiments of the invention may be operated with constant speed compressors and/or constant speed fans. In one respect, control of cooling fluid delivery to the racks 102–108 may be effectuated based upon the pressure of the cooling fluid in the space 112. According to this embodiment, the pressure within the space 112 may be controlled through operation of, for example, a plurality of vents 116 positioned at various locations in the data center 100. That is, the pressure within the space 112 may be kept essentially constant throughout the space 112 by selectively controlling the output of cooling fluid through the vents 116. By way of example, if the pressure of the cooling fluid in one location of the space 112 exceeds a predetermined level, a vent located substantially near that location may be caused to enable greater cooling fluid flow therethrough to thereby decrease the pressure in that location. A more detailed description of this embodiment may be found in U.S. application Ser. No. 10/303,761, filed on Nov. 26, 2002 and U.S. application Ser. No. 10/351,427, filed on Jan. 27, 2003, which are assigned to the assignee of the present invention and are hereby incorporated by reference in their entireties.

In addition, or as an alternative to the compressor 128, a heat exchanger (not shown) may be implemented in the air conditioning unit 114 to cool the fluid supply. The heat exchanger may comprise a chilled water heat exchanger, a centrifugal chiller (e.g., a chiller manufactured by YORK), and the like, that generally operates to cool air as it passes over the heat exchanger. The heat exchanger may comprise a plurality of air conditioners. The air conditioners may be supplied with water driven by a pump and cooled by a condenser or a cooling tower. The heat exchanger capacity may be varied based upon heat dissipation demands. Thus, the heat exchanger capacity may be decreased where, for example, it is unnecessary to maintain the cooling fluid at a relatively low temperature.

In operation, cooling fluid generally flows from the fan 122 into the space 112 as indicated by the arrow 132. The cooling fluid flows out of the raised floor 110 and into various areas of the racks 102–108 through the plurality of vents 116 as indicated by the arrows 134

As the cooling fluid flows out of the vents 116, the cooling fluid may flow into the racks 102–108. The racks 102–108 generally include inlets (not shown) on their front sides to receive the cooling fluid from the vents 116. The inlets generally comprise one or more openings to enable the cooling fluid to enter the racks 102–108. In addition, or alternatively, the front sides of some or all of the racks 102–108 may comprise devices for substantially controlling the flow of cooling fluid into the racks 102–108. Examples of suitable devices, e.g., louver assemblies and angled panels, are described in commonly assigned U.S. patent application Ser. Nos. 10/425,621 and 10/425,624, both of which were filed on Apr. 30, 2003, the disclosures of which are hereby incorporated by reference in their entireties.

The cooling fluid may become heated by absorbing heat dissipated from components located in the racks 102–108 as it flows through the racks 102–108. The heated air may generally exit the racks 102–108 through one or more outlets located on the rear sides of the racks 102–108. In addition, or alternatively, the rear sides of some or all of the racks 102–108 may comprise devices for substantially controlling the flow of cooling fluid into the racks 102–108 and/or controlling the flow of heated air out of the racks 102–108. Again, examples of suitable devices, e.g., louver assemblies and angled panels, are described in commonly assigned U.S. patent application Ser. Nos. 10/425,621 and 10/425,624.

The flow of air through the racks 102–108 may substantially be balanced with the flow of air through the vents 116 through operation of the above-described devices in manners consistent with those manners set forth in the above-identified co-pending applications. In addition, a proportional relationship may be effectuated between the airflow through the racks 102–108 and the vents 116. By virtue of controlling the airflow in the manners described in those co-pending applications, the level of re-circulation between the heated air flow and the cooling fluid may substantially be reduced or eliminated in comparison with known cooling systems.

The air conditioning unit 114 may vary the amount of cooling fluid supplied to the racks 102–108 as the cooling requirements vary according to the heat loads in the racks 102–108, along with the subsequent variations in the volume flow rate of the cooling fluid. As an example, if the heat loads in the racks 102–108 generally increases, the air conditioning unit 114 may operate to increase one or more of the supply and temperature of the cooling fluid. Alternatively, if the heat loads in the racks 102–108 generally decreases, the air conditioning unit 114 may operate to decrease one or more of the supply and temperature of the cooling fluid. In this regard, the amount of energy utilized by the air conditioning unit 114 to generally maintain the components in the data center 100 within predetermined operating temperature ranges may substantially be optimized.

As an alternative, there may arise situations where the additional cooling fluid flow to the racks 102–108 causes the temperatures of the components to rise. This may occur, for example, when a relatively large amount of heated air is re-circulated into the cooling fluid. In this situation, and as will be described in greater detail hereinbelow, cooling fluid delivery may be reduced in response to increased component temperatures. In addition, cooling fluid delivery may be increased in response to decreased component temperatures. It should therefore be understood that the present invention is not limited to one operational manner as temperatures in the data center 100 vary.

Through operation of the vents 116, the above-described devices, and the air conditioning unit 114, global and zonal control of the cooling fluid flow and temperature may be achieved. For instance, the vents 116 and the above-described devices generally provide localized or zonal control of the cooling fluid flow to the racks 102–108. In addition, the air conditioning unit 114 generally provides global control of the cooling fluid flow and temperature throughout various portions of the data center 100. By virtue of the zonal and global control of the cooling fluid, the amount of energy consumed by the air conditioning unit 114 in maintaining the components of the racks 102–108 within predetermined operating temperature ranges may substantially be reduced in comparison with conventional data center cooling systems.

A plurality of temperature sensors 136–144, e.g., thermistors, thermocouples, etc., may be positioned at various locations throughout the data center 100. By way of example, temperature sensors 136 may be provided at the inlets of the racks 102–108 to detect the temperature of the cooling fluid delivered into the racks 102–108. Temperature sensors 138 may be provided at the outlets of the racks 102–108 to detect the temperature of the heated air exhausted from the racks 102–108. Temperature sensors 140 may further be located at the vents 116 to detect the temperature of the cooling fluid supplied from the space 112. In addition, temperature sensors 142, 144 may respectively be positioned near the inlet and outlet of the air conditioning unit 114 to respectively detect the temperatures of the heated air entering the air conditioning unit 114 and the cooling fluid delivered to the space 112.

The temperature sensors 136–144 may communicate with one another and/or a computer configured to control operations of the data center cooling system (e.g., air conditioning unit 114, vents 116, etc.). The communication may be effectuated via a wired protocol, such as IEEE 802.3, etc., wireless protocols, such as IEEE 801.11b, 801.11g, wireless serial connection, Bluetooth, etc., or combinations thereof. In addition, or alternatively, one or more of the temperature sensors 136–144 may comprise location aware devices as described in co-pending and commonly assigned U.S. patent application Ser. No. 10/620,272, filed on Jul. 9, 2003, entitled "LOCATION AWARE DEVICES", the disclosure of which is hereby incorporated by reference in its entirety. As described in that application, these devices are termed "location aware" because they are operable to determine their general locations with respect to other sensors and/or devices and to communicate with one another through wireless communications.

In FIG. 1, a robotic device 146 is depicted as being located between racks 104 and 106. The robotic device 146 contains sensors 148 for detecting one or more conditions in the data center 100. The detected conditions may include, for example, sounds, images, environmental conditions (e.g., temperature, pressure, air flow, humidity, location, etc.), etc. In one embodiment, the robotic device 146 may transmit the detected conditions to a user, e.g., a controller external to the robotic device 146, which may be animate or inanimate. The user may rely upon the detected conditions to vary the position and orientation of the robotic device 146. In another embodiment, the robotic device 146 may process the detected conditions and perform certain actions in response to the detected conditions, some of which are described in greater detail hereinbelow.

The robotic device 146 also contains a manipulator assembly 150. The manipulator assembly 150 may comprise a manipulator and a camera. In one regard, the robotic device 146 may use the manipulator to manipulate various objects in the data center 100 in response to instructions received from a user or to the conditions detected by the sensors 148. The robotic device 146 may also use the camera to image the various objects for transmission to a user who may view and control operations of the manipulator. In addition, or alternatively, the robotic device 146 may use an image recognition software to identify the objects imaged and implement software to determine how the manipulator should be operated in response to the identified device. For example, the camera of the manipulator assembly 150 may image an object located on top of a vent 1116 and may determine that the object is covering the vent 116. The robotic device 146 may determine that the object is out of place and may operate the manipulator to move or remove the object.

The mobile device 146 may be configured to travel around the racks 102–108 to determine the conditions at various locations throughout the data center 100. In one regard, the mobile device 146 may enable temperatures in the data center 100 to be detected at various locations thereof while requiring substantially fewer temperature sensors. A more detailed description of the mobile device 146 and its operability related to environmental condition sensing functions may be found in co-pending and commonly assigned U.S. application Ser. No. 10/157,892, filed on May 31, 2002, the disclosure of which is hereby incorporated by reference in its entirety.

As described in the Ser. No. 10/157,892 application, the mobile device 146 may be a self-propelled mechanism configured for motivation around the racks 102–108 of the data center 100. In addition, the mobile device 146 generally includes a plurality of sensors configured to detect one or more environmental conditions at various heights. The mobile device 146 may transmit the environmental condition information to an air conditioning unit controller (not shown) which may utilize the information in determining delivery of cooling fluid to the racks 102–108 in the data center 100. In addition, the mobile device 146 may transmit the environmental condition information to vent controllers (not shown) configured to operate dynamically controllable vents 116.

According to another embodiment, the mobile device 146 may receive environmental information from temperature sensors comprising configurations similar to the location aware device described hereinabove. For example, the sensors may transmit a temperature measurement to the mobile device 146 indicating a hot spot, e.g., a location where the temperature is substantially above normal. The mobile device 146 may alter its course to travel to the detected hot spot to verify the temperature measurement by the sensors.

Figure 2A:
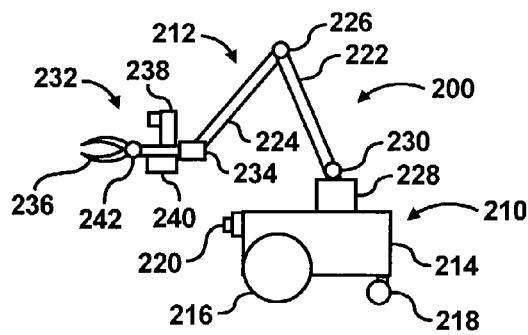
FIGS. 2A–2C illustrate various robotic device configurations for performing embodiments of the invention.
Figure 2B:
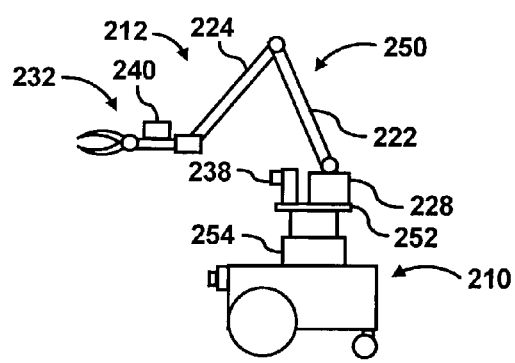
Figure 2C:
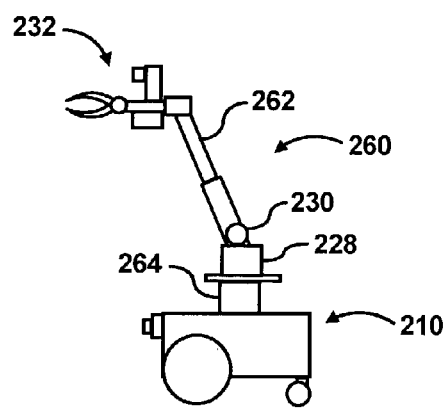

FIGS. 2A–2C illustrate various robotic device (200, 250, and 260) configurations for performing embodiments of the invention. Although specific reference is made to the robotic device configurations shown in FIGS. 2A–2C as being designed for performing various embodiments of the invention, these configurations are provided as examples of suitable configurations for performing these embodiments. It should be understood that numerous other robotic configurations may be implemented in the performance of the various embodiments of the invention without departing from the scope of the invention. In addition, it should be understood that the robotic device configurations illustrated in FIGS. 2A–2C may include additional components and that some of the components described may be removed and/or modified without departing from the scope of the invention.

With reference first to FIG. 2A, there is shown a robotic device 200 generally composed of a vehicle body 210 and an arm assembly 212. The vehicle body 210 includes a chassis 214 designed to support the arm assembly 212. In addition, the chassis 214 includes a plurality of wheels 216 and 218. One or more wheels 218 may be provided to enable directional control of the robotic device 200. In this regard, the wheel 218 may be attached to chassis 214 in a manner that enables rotation of the wheel 218 along the horizontal axis. The wheels 216 may be connected to a drive shaft and may enable movement of the robotic device 200. Also attached to the chassis 214 is a sensor assembly 220 designed to sense the environment around the robotic device 200. In this regard, the sensor assembly 220 may comprise a camera and/or a laser navigation tool. A suitable vehicle body 210 may comprise the PIONEER3-DX from ACTIVMEDIA located in Amherst, N.H.

The arm assembly 212 illustrated in FIG. 2A includes a pair of linkages 222 and 224. The linkages 222 and 224 are attached to each other at respective ends thereof in a manner that generally enables the angle between the linkages 222 and 224 to be varied. In this respect, the joint 226 coupling the linkages 222 and 224 may comprise an actuator configured to vary the angle of the linkage 224 from the linkage 222. The linkage 222 is attached to an arm base 228 which is configured to rotate the arm assembly 212 along the horizontal axis. In addition, the linkage 222 is attached to the arm base 228 via a joint 230 that generally enables the angle of the linkage 222 to be varied.

Attached at the end of the linkage 224 opposite the joint 226 is a manipulator assembly 232 via an actuator 232. The actuator 232 is configured to rotate the manipulator assembly 232 along the vertical and horizontal axes. The manipulator assembly 232 is composed of a manipulator 236, a camera 238, and a sensor 240. The manipulator 236 is illustrated as a grappling device composed of two prong-like devices. The manipulator 236 may be positioned into various configurations through rotation of the prong-like devices. In this respect, the prong-like devices may be attached to an actuator 242. Although the manipulator 236 is illustrated as comprising prong-like devices, it should be understood that the manipulator 236 may comprise any suitable configuration, e.g., a pointing device, a bar-shape, a rounded configuration, a combination of configurations, etc., without departing from the scope of the invention.

The camera 238 may comprise a digital camera or a video camera configured to image areas in front of the manipulator assembly 232. The camera 238 may also comprise an infrared camera configured to perform infrared imaging of the various sections of the data center. In addition, the sensor 240 may comprise one or more sensors configured to detect one or more conditions in a data center. For example, the sensor 240 may comprise sensors for detecting environmental conditions, e.g., temperature, humidity, pressure, etc., auditory sensors, smoke and/or gas detectors, infrared sensors, and the like.

With reference now to FIG. 2B, there is shown a robotic device 250 according to a second embodiment. The robotic device 250 includes many of the same components as the robotic device 200 illustrated in FIG. 2A. Therefore, only those components that differ from the robotic device 200 will be described with respect to FIG. 2B. The description hereinabove of the robotic device 200 is thus relied upon as providing adequate disclosure of the similar components comprising the robotic device 250.

As illustrated in FIG. 2B, the robotic device 250 generally comprises a vehicle body 210, an arm assembly 212, and a manipulator assembly 232. The base 228 supporting the arm assembly 212 generally comprises a platform 252 raised above the vehicle body 210. The platform 252 is positioned on a lifting mechanism 254, e.g., a hydraulic lift assembly. In addition, the camera 238 is positioned on the platform 252 and may be rotated along the horizontal and vertical axes with respect to the platform 252. Accordingly, the arm assembly 212 and the camera 238 may be positioned to various heights as desired or necessary.

FIG. 2C illustrates a robotic device 260 according to a third embodiment. Again, because the robotic device 260 includes many of the same components as the robotic device 200 illustrated in FIG. 2A, only those components that differ from the robotic device 200 will be described with respect to FIG. 2C. The description hereinabove of the robotic device 200 is thus relied upon as providing adequate disclosure of the similar components comprising the robotic device 250.

The robotic device 260 includes a vehicle body 210 and a manipulator assembly 232 as described hereinabove with respect to FIG. 2A. The robotic device 260 also includes an arm assembly 262 composed generally of a hydraulic pole configured to vary the position of the manipulator assembly 232 with respect to the vehicle body 210. The arm assembly 262 is attached to the base 228 via a joint 230 generally configured to enable the arm assembly 262 to be rotated along the horizontal and vertical axes. Alternatively, the base 228 may be attached to an actuator 264 configured to rotate the arm assembly 262 in the horizontal axis.

Figure 3:
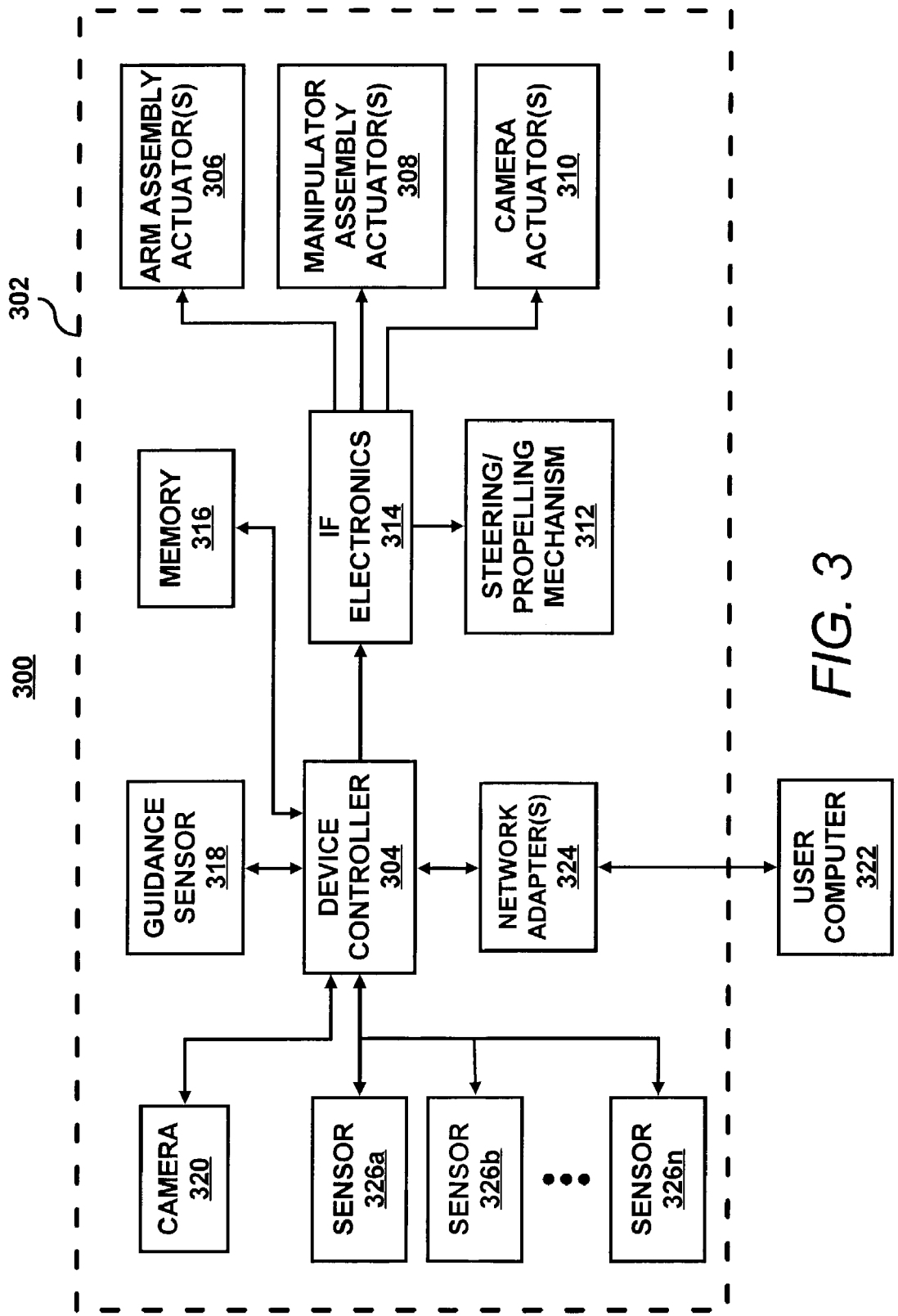
FIG. 3 is an exemplary block diagram for a robotic device according to an embodiment of the invention.

FIG. 3 is an exemplary block diagram 300 for a robotic device 302 according to an embodiment of the invention. It should be understood that the following description of the block diagram 300 is but one manner of a variety of different manners in which such a robotic device 302 may be configured. In addition, it should be understood that the robotic device 302 may include additional components and that some of the components described may be removed and/or modified without departing from the scope of the invention.

The robotic device 302 includes a device controller 304 configured to control the operations of the robotic device 302. By way of example, the device controller 304 may control actuators 306–310 and a steering/propelling mechanism 312. The device controller 304 may thus comprise a microprocessor, a micro-controller, an application specific integrated circuit (ASIC), and the like.

The actuators 306–310 may comprise direct current (DC) motors configured as arm assembly actuator(s) 306, manipulator assembly actuator(s) 308, and camera actuator(s) 310. The arm assembly actuator(s) 306 may be configured to vary the position of an arm assembly, e.g., arm assembly 212, 262, of the robotic device. In this regard, the arm assembly actuator(s) 306 may manipulate the position of a manipulator assembly, e.g., manipulator assembly 232, by varying the angles between linkages, e.g., linkages 222, 224, and a vehicle body, e.g., vehicle body 210. In addition, the arm assembly actuator(s) 306 may comprise controllers for manipulating the length of a hydraulic pole, e.g., arm assembly 262.

The manipulator assembly actuator(s) 308 may be configured to manipulate the angle of the manipulator assembly with respect to the arm assembly. In addition, the manipulator assembly actuator(s) 308 may be configured to manipulate one or more manipulators, e.g., manipulators 236. In this regard, the manipulator assembly actuator(s) may be configured to open and close a pair of prong-like devices to grasp and/or maneuver objects in the data center.

The camera actuator(s) 310 may be configured to manipulate the viewing direction of a camera, e.g., camera 238. The camera actuator(s) 310 may be configured to vary the viewing direction of the camera along one or more axes.

The steering/propelling mechanism 312 may be configured to control the motivation and direction of travel for the robotic device 302. The steering/propelling mechanism 312 may thus comprise actuators configured to vary these aspects of the robotic device 302 travel.

Interface electronics 314 may be provided to act as an interface between the device controller 304 and the actuators 306–310 and the steering/propelling mechanism 312. By way of example, the interface electronics 314 may vary the voltage supplied to the actuators 306–310 to thereby vary the positions of the arm assembly, manipulator assembly, and the camera.

The device controller 304 may also be interfaced with a memory 316 configured to provide storage of a computer software that provides the functionality of the robotic device 302. The memory 316 may be implemented as a combination of volatile and non-volatile memory, such as DRAM, EEPROM, flash memory, and the like. The memory 316 may also be configured to provide a storage for containing data/information pertaining to the manner in which the actuators 306–310 may be manipulated in response to, for example, various detected conditions in the data center. In one respect, the memory 316 may store data/information pertaining to outcomes of previous manipulations of the actuators 306–310. The controller 304 may operate the actuators 306–310 in manners relative to the data/information stored in the memory 316 in response to detected conditions. Alternatively, the computer software that provides the functionality of the robotic device 302 may be stored remotely from the robotic device 302.

The device controller 304 may receive information from a guidance sensor 318, e.g., sensor assembly 220. The received information may be in the form of detected locations of objects located around the robotic device 302. For instance, the guidance sensor 318 may comprise a laser guidance tool, sonar tool, a combination thereof, and the like, configured to detect the distances of objects located within the field of view of the tool. As another example, the guidance sensor 318 may comprise a camera assembly configured to image objects within its field of view. The images obtained by such a camera assembly may be displayed to a user who may operate the robotic device 304 to avoid, for example, objects located in the path of the robotic device 304. In addition, or as an alternative, the device controller 304 may process the images, e.g., with image recognition software. In this regard, the device controller 304 may determine the objects located within the guidance sensor's 318 field of view, whether the object is an avoidable obstacle, and determine a path around the obstacle if it is avoidable.

The device controller 304 may also receive images obtained by a camera 320, e.g., camera 238. As described hereinabove with respect to FIGS. 2A–2C, the camera 320 may be positioned to obtain images in front of or around the manipulator assembly, e.g., manipulator assembly 232. In addition, the camera 320 may also be used to image various other sections of the data center, for example, to check the general state of the data center. In one regard, the images obtained may be used in controlling one or more of the actuators 306–310 in performing various functions with the manipulator assembly. The images obtained by the camera 320 may be transmitted to a third party, e.g., a user computer 322 for display to a user. The user may be defined as any external controller, either animate or inanimate. In addition, the transmission of this information, as well as other information between the device controller 304 and the user computer 322 may be performed through one or more network adapters 324. The user may manually operate the robotic device 302, e.g., maneuver the robotic device 302 through operation of the steering/propelling mechanism, manipulate one or more of the actuators 306–310, etc., in response to the displayed images.

In addition, or alternatively, the device controller 304 may implement an image recognition software stored in the memory 316 to identify the captured image. For example, a server may appear in the captured image, which the device controller 304 may recognize. The image may also indicate that a fault signal, e.g., a blinking red light, is active. In this instance, the device controller 304 may initiate a program to cause one or more of the actuators 306–310 to position the manipulator assembly into position to perform a hard reboot of the server. This process may include positioning the manipulator assembly to depress a power button located on the server.

As another example, the device controller 304 may implement a program to load and/or unload a disk from a disk drive. This process may include positioning the manipulator assembly to a location in front of the disk drive, depressing an "eject" button on the disk drive, and grasping the disk to remove it from the disk drive. This process may also include grasping a disk and inserting it in the correct orientation into the disk drive.

The robotic device 302 may comprise a plurality of sensors 326a–326n located at various positions of the robotic device 302. For instance, one or more of the sensors 326a–326n may be provided on the manipulator assembly (e.g., FIG. 2A), on a platform (e.g., 252, FIG. 2B), or on the vehicle body of the robotic device 302. The sensors 326a–326n may comprise one or more sensors for detecting environmental conditions, e.g., temperature, humidity, pressure, etc., auditory sensors, smoke and/or gas detectors, infrared sensors, and the like.

The device controller 304 may receive detected information from the sensors 326a–326n through wired connections or through wireless protocols, such as IEEE 801.11b, 801.11g, wireless serial connection, Bluetooth, etc., or combinations thereof.

According to an embodiment of the invention, and as described hereinabove with respect to U.S. patent application Ser. No. 10/620,272, the sensors 326a–326n may comprise location aware devices. Through use of location aware devices as described in that application, the device controller 304 may determine and store the locations of the various sensors. In addition, the device controller 304 may wirelessly receive detected information from the sensors 326a–326n.

Although not illustrated in FIG. 3, the robotic device 302 may also include a display device, e.g., a monitor, one or more speakers, and a microphone. The robotic device 302 may detect audible alerts, e.g., alarms sounding from a component in the data center, and may relay that information to a user. In addition, the robotic device 302 may function to play an alarm or otherwise cause sound to be transmitted through the speakers to provide information, for example, to personnel in the data center 100. Moreover, the robotic device 302 may function as a repository for electronic data sheets by including a tray to support these data sheets.

Figure 4:
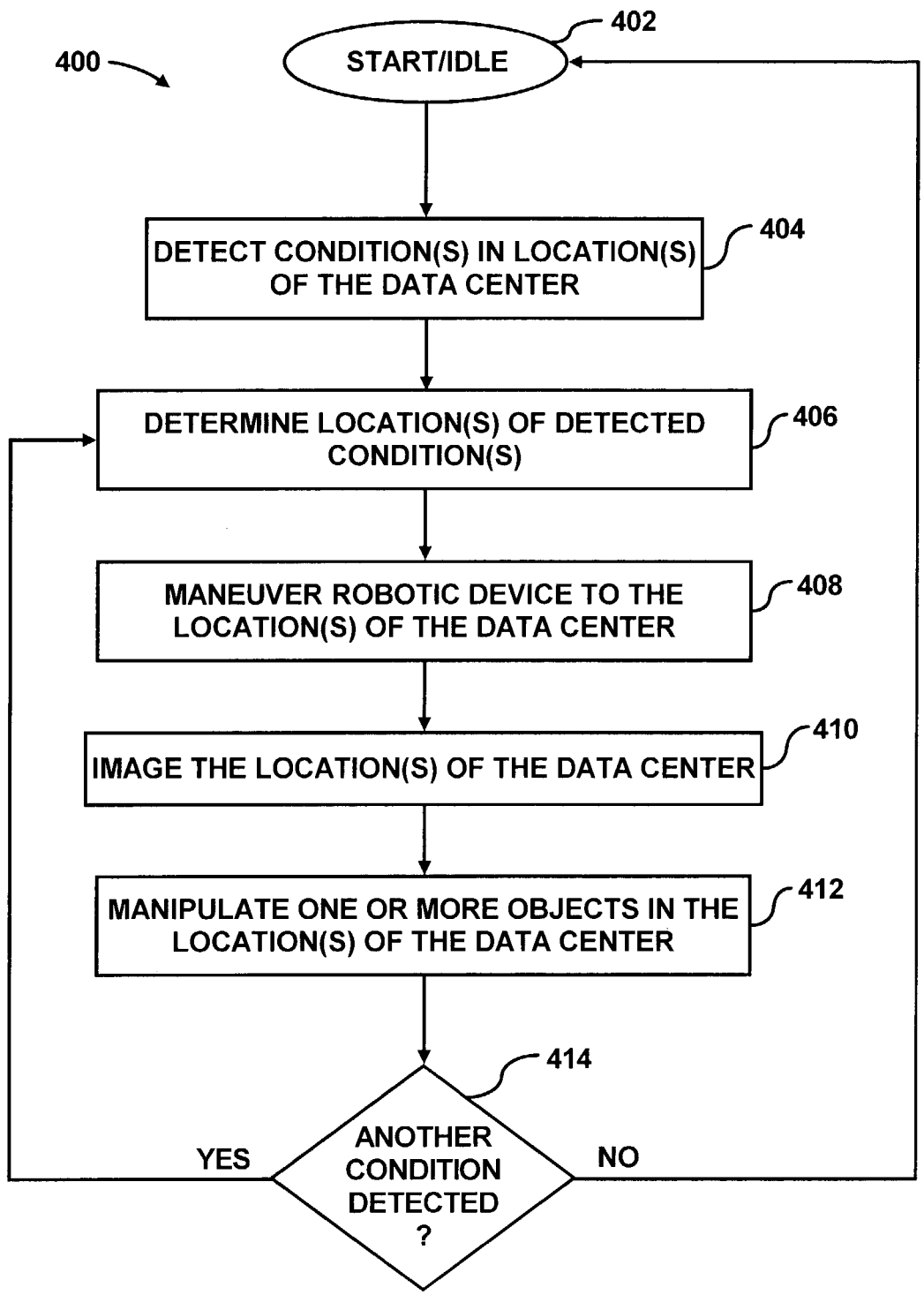
FIG. 4 illustrates an exemplary flow diagram of an operational mode of a robotic device, according to an embodiment of the invention.

FIG. 4 illustrates an exemplary flow diagram of an operational mode 400 of a robotic device, e.g., robotic device 302, according to an embodiment of the invention. It is to be understood that the following description of the operational mode 400 is but one manner of a variety of different manners in which an embodiment of the invention may be operated. It should also be apparent to those of ordinary skill in the art that the operational mode 400 represents a generalized illustration and that other steps may be added or existing steps may be removed or modified without departing from the scope of the invention. The description of the operational mode 400 is made with reference to the block diagram 300 illustrated in FIG. 3, and thus makes reference to the elements cited therein. It should, however, be understood that the operational mode 400 is not limited to the elements set forth in the block diagram 300. Instead, the operational mode 400 may be performed with a robotic device having any reasonably suitable configuration.

The device controller 304 may implement the operational mode 400 to operate the robotic device 302 in the performance of various functions in the data center 100. The operational mode 400 may be initiated in response to a variety of stimuli at step 402. For example, the operational mode 400 may be initiated in response to a predetermined lapse of time, in response to receipt of a transmitted signal, and/or in response to a detected change in a condition of the data center 100 (e.g., alarm detection, gas detection, smoke detection, temperature, humidity, location of the robotic device, etc.).

At step 404, the sensors 326a–326n may detect one or more conditions in the data center 100. Alternatively, other sensors, e.g., sensors 136–142, may detect the one or more conditions in the data center 100 or a component located in the data center 100 may indicate that a problem exists (e.g., a server is not working properly, etc.). At step 406, the locations of the detected one or more conditions may be determined. The device controller 304 may perform the determination of these locations or a user may determine their locations. In any case, the locations may be determined through knowledge of the locations of the sensors and/or servers., which may be stored in the memory 316. In addition, the location of the robotic device 302 may be used to determine the locations of the detected conditions.

Also at step 404, the robotic device 302 may detect conditions in one or more areas of the detected condition locations. The step may involve a determination by the robotic device 302 of whether the robotic device 302 has sufficient information to determine that a problem exists and/or to determine a resolution to an existing problem. Therefore, for example, the robotic device 302 may perform multiple condition detections around the locations of the detected conditions.

The location of the robotic device 302 in the data center 100 may be tracked in a variety of manners. For example, one or more cameras may be provided in the data center to image the robotic device 302 and to thus determine its location. As another example, a plurality of position markers may be placed throughout the data center 100 which the robotic device 302 may implement to determine its location. As another example, the robotic device 302 may have a map of the data center layout stored in its memory 316 which it may use to determine its location or it may rely upon global positioning system (GPS) technologies. As a yet further example, location aware devices, as described hereinabove, may be used to track the location of the robotic device 302. Although specific examples of tracking the location of the robotic device 302 have been presented, it should be understood that these examples are not exhaustive of the possible manners in which the robotic device 302 may be tracked. In this regard, it should be appreciated that numerous other tracking manners may be implemented without departing from the scope of the invention.

At step 408, the robotic device 302 may be maneuvered to the determined locations of the data center 100. It should be understood that step 408 may be optional in the event that the robotic device 302 is already at the determined locations. However, should the robotic device 302 require maneuvering to the determined locations, the robotic device 302 may be remotely maneuvered by a user to the determined locations. Alternatively, the robotic device 302 may determine a route to the determined locations. This determined route may comprise a route that may take the shortest amount of time, for example. The robotic device 302 may follow the determined route and make any necessary adjustments in the event that obstacles are present along the route.

At step 410, the robotic device 302 may image the determined locations with the camera 238. The images obtained by the camera 238 may be sent to the user who may verify that the determined locations are accurate. The user may use the obtained images in manipulating one or more objects in the locations at step 412. In this regard, the camera 238 may be configured to obtain substantially real-time images of the locations and the objects.

In addition, at step 410, the robotic device 302 may image multiple areas of the determined locations with the camera 238. In this regard, images from various angles of the determined locations may be used to determine whether problems exist and/or to determine possible solutions to detected problems.

At step 414, the device controller 302 may determine whether another condition has been detected. If there has been another condition detected, the device controller 302 may cause steps 406–414 to be repeated. If there has not been another condition detected, the device controller 302 may cause the robotic device 302 to enter into an idle state as indicated by step 402. The idle state may comprise maneuvering the robotic device 302 to a base station where the power source, e.g., DC battery, of the robotic device 302 may be recharged.

Steps 404–414 may constitute any number of condition detections and object manipulations. In addition, the object manipulations may comprise manipulations performed by the robotic device 302 or they may comprise manipulations performed in response to instructions received from the robotic device 302. In the following paragraphs, a very few number of possible operations are described. The possible operations listed below are not to be construed as limiting the invention to the specific listed operations. Instead, it should be understood that embodiments of the invention may include any reasonably suitable operations capable of being performed by the robotic device 302 in the operational mode 400.

According to a first example, the robotic device 302 may be configured to perform a manual re-boot of a server or other electronic component in the data center 100. In this example, the condition detected at step 404 may comprise the detection of a malfunctioning or non-responsive server. The location of the server may be determined through accessing a table that correlates the IP address or the serial number of the server and its location in the data center 100 at step 406. The robotic device 302 may be maneuvered to the location of the server in a manner described hereinabove at step 408.

At step 410, the robotic device 302 may image the server. The image of the server may be used to determine whether any fault signals are present, e.g., blinking lights, no lights, etc. In addition, the image may be used to determine the location of a power switch. Assuming that a re-boot is necessary, the robotic device 302 may be remotely controlled to depress the power switch. Alternatively, the robotic device 302 may be configured to automatically position the manipulator to depress the power switch. After the server has powered down as can be verified through the obtained image, or through waiting a pre-set amount of time, the robotic device 302 may be configured to depress the power switch again to turn the server on. Alternatively, the robotic device 302 may be manipulated to depress the power switch for a pre-set amount of time to cause the server to re-boot. In addition, the robotic device 302 may be configured to perform a staged power-down operation.

As another example, the robotic device 302 may be used to untangle wires and/or to remove objects from the floor of the data center 100. At step 404, the detected condition according to this example may comprise, for instance, images of tangled wires, objects located in the aisles, and other debris that may constitute a safety hazard. These conditions may be detected by the robotic device 302 or they may be detected through cameras located in the data center 100. If these conditions are detected by the robotic device 302, it may be unnecessary to maneuver the robotic device 302 to the location of the detected condition. On the other hand, the robotic device 302 may be maneuvered to the location of the detected condition if other cameras or personnel in the data center 100 detect these conditions. In addition, step 410 may be unnecessary as the image of the location may have already been obtained or may already be in the process of being obtained.

At step 412, the robotic device 302 may be operated to move the wires and/or objects. The user may remotely control the robotic device 302 to perform these operations. Alternatively, the robotic device 302 may implement an algorithm stored in its memory 316 designed to control the manipulator operations to perform these functions. In any respect, the robotic device 302 may be used to remove objects that may be impeding airflow through the vents 116.

As a further alternative, the robotic device 302 may itself be used as an impediment to airflow through the vents 116. In this embodiment, the robotic device 302 may comprise wing-like mechanisms designed to substantially prevent the flow of air therethrough.

The following examples relate to the use of the robotic device 302 in manipulating components of a data center cooling system as described hereinabove.

According to a first example, the robotic device 302 may be implemented in varying the airflow through one or more racks 102–108. The robotic device 302 may cause variance of the airflow through the racks 102–108 through manipulation of a plurality of cooling system components. For example, the robotic device 302 may vary the direction and/or magnitude of airflow through the vents 116 by manipulating the vanes of the vents 116. The robotic device 302 may vary the airflow through the racks 102–108 by manipulating louvers and/or angled panels located on the front and/or rear panels of the racks. The robotic device 302 may also vary the configuration of return vents (not shown) to vary the direction and volume flow rate of heated airflow through the return vents. In addition, the robotic device 302 may also manipulate return vents on air conditioning units.

At step 404, the robotic device 302 or other sensors, e.g., sensors 136–142, located in the data center 100 may detect the one or more conditions. In this regard, the detected conditions may comprise environmental conditions, e.g., temperature, pressure, humidity, etc. In addition, the detected conditions may comprise noise or other sounds produced by components in the data center 100. For instance, an improperly cooled server may produce a relatively loud noise, e.g., the fan of the server may be operating at a substantially high level in an attempt to cool the components located in the server. In this case, the server may be receiving insufficient cooling fluid to cause the temperature in the server to be within normal operating ranges.

As another example, the robotic device 302 may detect an improperly functioning air conditioning unit through detection of noise produced by the air conditioning unit during operation thereof. In this example, the robotic device 302 may detect that an air conditioning unit is producing abnormally high levels of noise and/or producing a particular frequency of noise, e.g., an imbalanced rotating mechanism may rotate at a specific frequency, and determine the location of the air conditioning unit at step 406. The robotic device 302 may also determine the general location in the air conditioning unit where the noise is being produced. The robotic device 302 may transmit this information to the user who may identify the cause of the noise.

At step 406, the location of the detected one or more conditions may be determined. By way of example, these locations may be determined through knowledge of the sensor, e.g., 136–138 locations, the location of the robotic device 302, or the robotic device 302 may determine the locations of the one or more conditions. For the latter, the robotic device 302 may be capable of determining the source of the one or more conditions, e.g., by determining various locations where the noise is the loudest or the detected environmental condition is the highest.

At step 408, the robotic device 302 may be maneuvered to the locations of the one or more detected conditions in manners described hereinabove. At step 410, the robotic device 302 may image the locations of the one or more detected conditions. The images obtained may be fed to the user substantially in real-time. The image(s) of the locations may be used to determine the cause of the one or more detected conditions. For example, a user may determine that a temperature rise in one of the racks, e.g., rack 102, may be due to blockage of a vent 116 configured to supply cooling fluid to the rack. The user may operate the robotic vehicle 302 to remove the blockage to thus enable substantially free flow of cooling fluid to the rack at step 410.

In addition, at step 410 a user may determine that a resolution to bring the one or more detected conditions within normal conditions may be to manipulate one or more of the cooling system components as described hereinabove. In this respect, the user may operate the robotic device 302 to perform these functions. Alternatively, the robotic device 302 may instruct one or more of the cooling system components to become manipulated to produce the desired outcomes. In addition, the user may instruct the robotic device 302 to remain near the location of the detected condition to determine whether the manipulation performed resulted in a desired outcome. Alternatively, the robotic device 302 may be programmed to remain at the location for a pre-set period of time and obtain additional condition measurements to determine whether the manipulation performed resulted in a desired outcome. In the event that the additional condition measurements indicate that the manipulations did not produce the intended effects, the robotic device 302 may be operated to perform additional manipulations.

Figure 5:
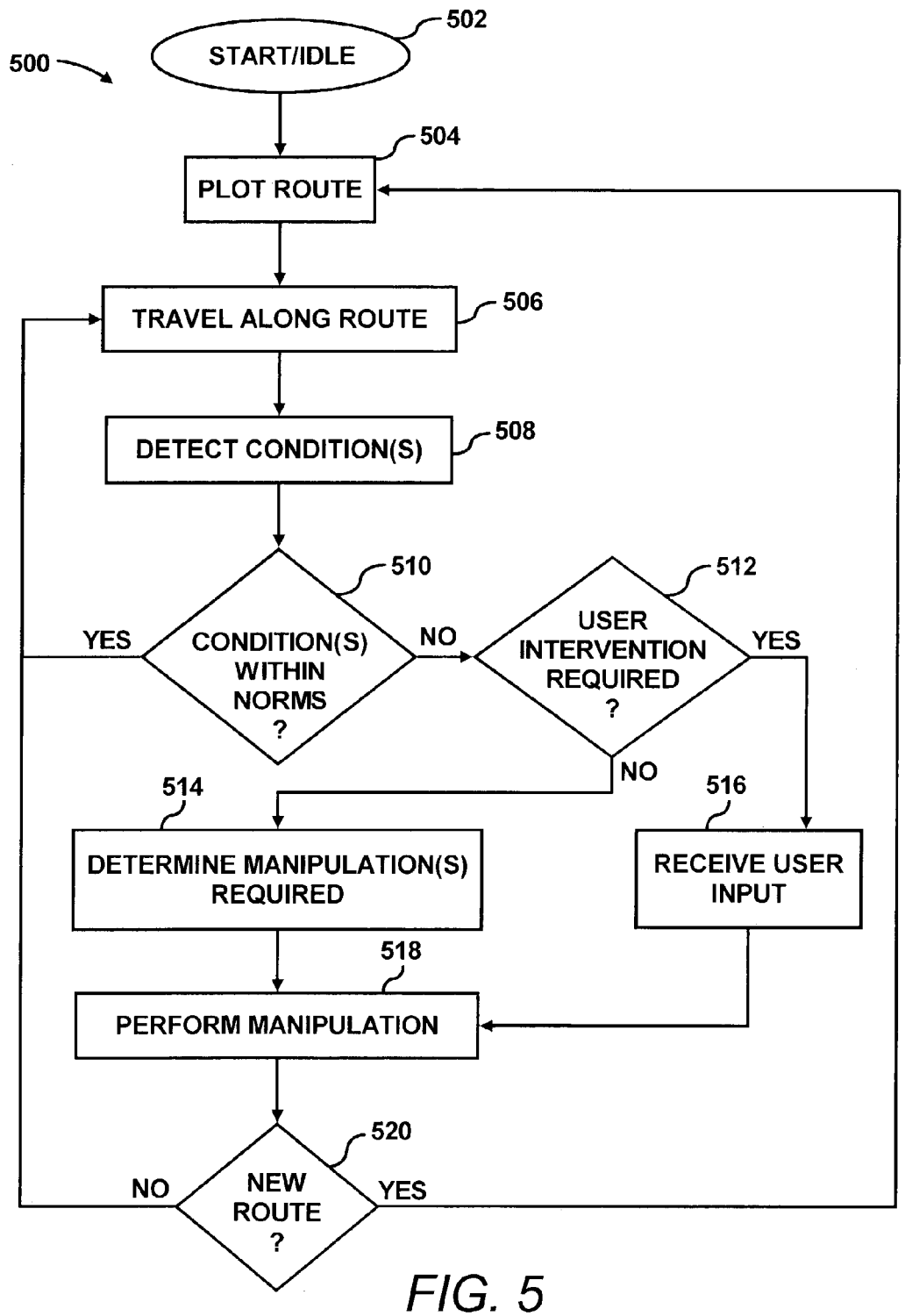
FIG. 5 shows an exemplary flow diagram of an operational mode of a robotic device, according to another embodiment of the invention.

With reference now to FIG. 5, there is shown an exemplary flow diagram of an operational mode 500 of a robotic device, e.g., robotic device 302, according to another embodiment of the invention. It is to be understood that the following description of the operational mode 500 is but one manner of a variety of different manners in which an embodiment of the invention may be operated. It should also be apparent to those of ordinary skill in the art that the operational mode 500 represents a generalized illustration and that other steps may be added or existing steps may be removed or modified without departing from the scope of the invention. The description of the operational mode 500 is made with reference to the block diagram 300 illustrated in FIG. 3, and thus makes reference to the elements cited therein. It should, however, be understood that the operational mode 500 is not limited to the elements set forth in the block diagram 300. Instead, the operational mode 500 may be performed with a robotic device having any reasonably suitable configuration.

The device controller 304 may implement the operational mode 500 to operate the robotic device 302 in the performance of various functions in the data center 100. The operational mode 500 may be initiated in response to a variety of stimuli at step 502. For example, the operational mode 500 may be initiated in response to a predetermined lapse of time, in response to receipt of a transmitted signal, and/or in response to a detected change in a condition of the data center 100 (e.g., alarm detection, gas detection, smoke detection, temperature, humidity, location of the robotic device, etc.).

At step 504, the route the robotic device 302 is to take around the data center 100 is plotted. For instance, the route may comprise a route that enables the robotic device 302 to cover various sections of the data center 100 or a major portion of the data center 100. The robotic device 302 may plot the route or the robotic device 302 may receive route instructions from the user. In either instance, the robotic device 302 may travel along the route as indicated by step 506.

As the robotic device 302 travels along the plotted route, which may include provisions for the robotic device 302 to stop at various points to perform detection of the various conditions listed above, the robotic device 302 may detect the various conditions at step 508. In addition, step 508 may include provisions for the robotic device 302 to obtain multiple condition measurements in areas of various locations along the plotted route. For instance, the robotic device 302 may obtain multiple condition measurements to determine relatively more accurate condition information and/or to determine possible solutions to determined problems.

At step 510, the detected conditions may be compared with normal operating conditions to determine whether they are outside of the normal operating conditions. For instance, with respect to the cooling system example above, the detected condition may comprise temperature and the normal operating conditions may comprise the optimum operating temperature ranges for components, e.g., as set forth by the component manufacturers. As another example, if a server is malfunctioning, e.g., the robotic device 302 images a server with a blinking light, the blinking light may be considered as being outside of the normal operating conditions for that server.

If the conditions are determined as being within normal operating conditions, the robotic device 302 may continue traveling along the plotted route. If the detected conditions are outside of the normal operating conditions, the device controller 304 may determine whether user intervention is required at step 512. User intervention may be required if the device controller 304 is unable to determine what steps are necessary to bring the detected conditions to be within normal operating conditions. In this regard, the memory 316 of the robotic device 302 may store algorithms for determining various manipulations in response to various detected conditions. For example, an algorithm may comprise moving an object off of a vent 116 in response to the detected condition indicating that the object may be blocking the vent 16. As another example, an algorithm may comprise performing a re-boot operation in response to a server operating improperly.

If user intervention is not required, i.e., the device controller 304 may determine a corrective course of action on its own, the device controller 304 may determine which manipulations to perform at step 514. Alternatively, if user intervention is required, the device controller 304 may receive instructions from the user at step 516. The user intervention may comprise a set of instructions for the robotic device 304 to perform. In either event, the robotic device 302 may perform the manipulation it has determined or has received from the user. In addition, the user may remotely operate the robotic device 302 to perform the manipulation. The robotic device 302 may also remain near the location of the performed manipulation to obtain additional condition measurements and to determine whether the manipulation performed resulted in the desired outcome.

At step 520, the device controller 304 may determine whether a new route is necessary in response to the manipulation performed. A new route may be required, for instance, when the device controller 304 remains at the location of the performed manipulation for any length of time. In addition, a new route may be required in the event that a scheduled time for performing a task has expired or the robotic device 302 is no longer required to travel to one or more planned locations.

If it is determined that a new route is not required, the robotic device 302 may continue along the plotted route as indicated at step 506. Alternatively, if a new route is required, a new route may be plotted as indicated at step 504.

Steps 504–520 may constitute any number of condition detections and object manipulations and may be similar to those condition detections and object manipulations described hereinabove with respect to FIG. 4.

The operations set forth in the operational modes 400 and 500 may each be contained as a utility, program, or a subprogram, in any desired computer accessible medium. In addition, the operational modes 400 and 500 may each be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated below.

Figure 6:
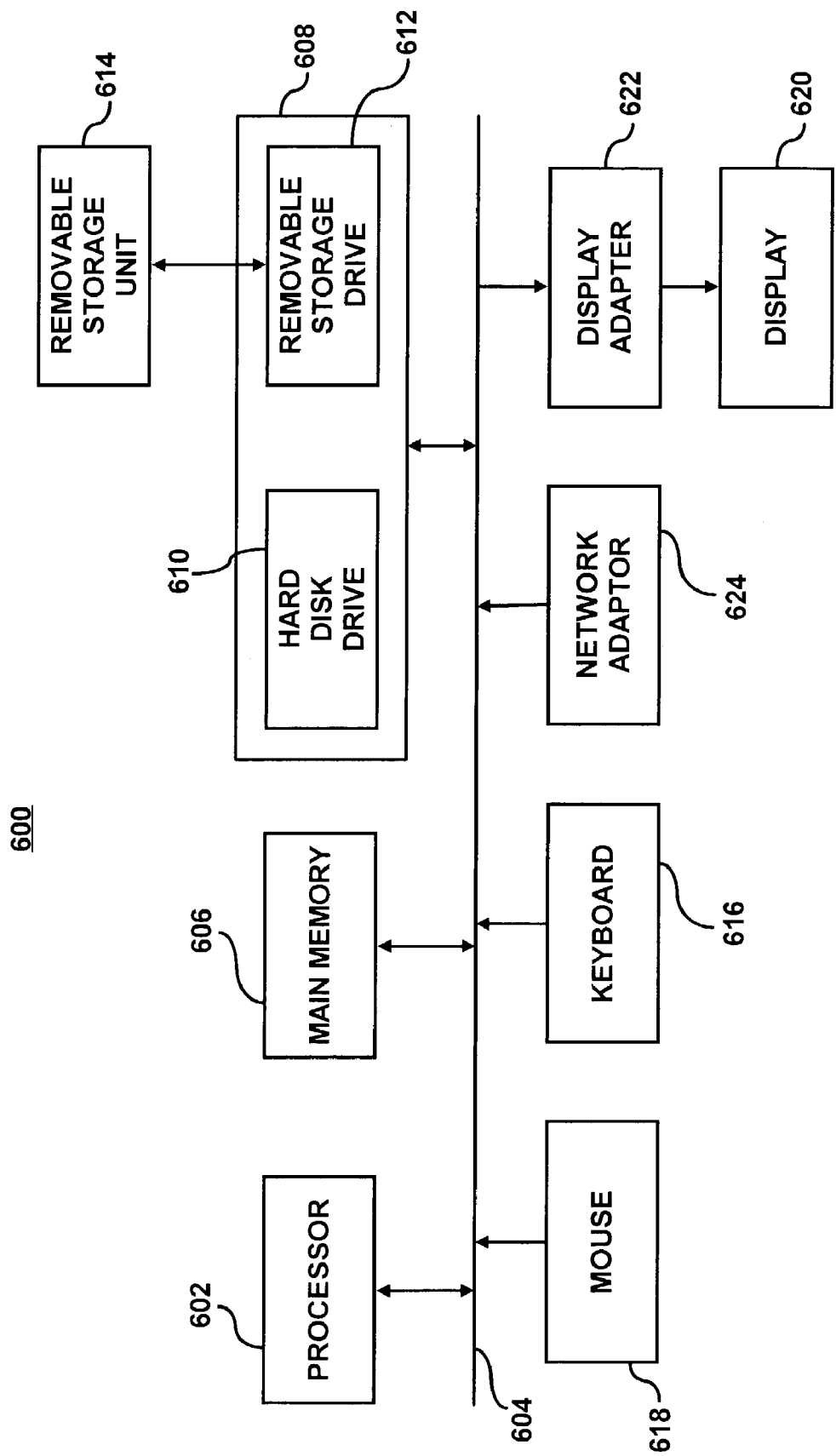
FIG. 6 illustrates an exemplary computer system according to an embodiment of the invention.

FIG. 6 illustrates an exemplary computer system 600, according to an embodiment of the invention. The computer system 600 may include the device controller 304 as well as the user computer 322 shown in FIG. 3. In this respect, the computer system 600 may be used as a platform for executing one or more of the functions described hereinabove with respect to the device controller 304 and the user computer 322.

The computer system 600 includes one or more controllers, such as a processor 602. The processor 602 may be used to execute some or all of the steps described in the operational modes 400 and 500. Commands and data from the processor 602 are communicated over a communication bus 604. The computer system 600 also includes a main memory 606, e.g., memory 316, such as a random access memory (RAM), where the program code for the robotic device 302 may be executed during runtime, and a secondary memory 608. The secondary memory 608 includes, for example, one or more hard disk drives 610 and/or a removable storage drive 612, representing a floppy diskette drive, a magnetic tape drive, a compact disk drive, etc., where a copy of the program code for the provisioning system may be stored.

The removable storage drive 610 reads from and/or writes to a removable storage unit 614 in a well-known manner. User input and output devices may include a keyboard 616, a mouse 618, and a display 620. A display adaptor 622 may interface with the communication bus 604 and the display 620 and may receive display data from the processor 602 and convert the display data into display commands for the display 620. In addition, the processor 602 may communicate over a network, e.g., the Internet, LAN, etc., through a network adaptor 624.

It will be apparent to one of ordinary skill in the art that other known electronic components may be added or substituted in the computer system 600. In addition, the computer system 600 may include a system board or blade used in a rack in a data center, a conventional "white box" server or computing device, etc. Also, one or more of the components in FIG. 6 may be optional (e.g., user input devices, secondary memory, etc.).

By virtue of certain embodiments of the present invention, the costs associated with operating a data center may be substantially reduced. In one respect, by performing activities that may be performed by personnel in the data center with a robotic device, the associated costs as well as the time and man-power involved in performing these activities may be reduced.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for operating a data center with a robotic device, said method comprising:
   detecting a condition in a location of the data center, wherein the condition comprises at least one of gas, smoke, noise, temperature, pressure, humidity, and airflow velocity;
   maneuvering the robotic device to travel to the location of the detected condition in the data center, wherein the robotic device comprises a camera and a manipulator;
   imaging the location of the detected condition in the data center with the camera of the robotic device; and
   manipulating an object with to manipulator of the robotic device around the location of the detected condition.

2. The method according to claim 1, wherein the robotic device further includes one or more sensors, said method further comprising:
   detecting one or more conditions in the location of the data center with the one or more sensors.

3. The method according to claim 1, wherein the step of detecting a condition in a location of the data center comprises detecting a condition in various areas of the location of the data center.

4. The method according to claim 1, wherein the step of maneuvering the robotic device to travel to the location of the data center further comprises remotely controlling the robotic device to travel to the location.

5. The method according to claim 1, further comprising:
   determining a route for the robotic device from a current position to a position near the location.

6. The method according to claim 5, wherein said step of determining a route for the robotic device comprises determining a shortest route from the current position to the position near the location.

7. The method according to claim 5, wherein said step of determining a route for the robotic device comprises determining a route for the robotic device which enables the robotic device to detect additional conditions in the location of the data center.

8. The method according to claim 1, wherein to step of detecting a condition in a location of the data center comprises detecting the condition with a sensor positioned substantially near the location of the data center.

9. The method according to claim 8, further comprising:
transmitting the condition detected with the sensor positioned substantially near the location to the robotic device.

10. The method according to claim 1, wherein said step of detecting a condition in a location of the data center further comprises detecting an object impeding airflow through a vent, and wherein said step of manipulating an object comprises moving said object.

11. The method according to claim 1, further comprising:
sounding an alarm located on to robotic device in response to the detected condition.

12. A method for operating a data center with a robotic device having a manipulator, said method comprising:
detecting a malfunctioning server in a location of the data center, maneuvering to robotic device to travel to the location of to detected malfunctioning server; and
depressing a power switch of to malfunctioning server with the manipulator of the robotic device to thereby deactivate the malfunctioning server.

13. A method for operating a data center with a robotic device, said method comprising:
plotting a route for the robotic device to travel in the data center;
maneuvering the robotic device to travel along the plotted route;
detecting one or more conditions in the data center with the robotic device, wherein the one or more conditions comprise at least one of gas, smoke, noise, temperature, pressure, humidity, airflow velocity, server performance, and vent impedance;
determining whether the one or more conditions in the data center are within respective norms; and
manipulating one or more objects in response to the one or more conditions being outside the respective norms.

14. The method according to claim 13, further comprising:
determining whether user intervention is required in response to the one or more conditions being outside the respective norms.

15. The method according to claim 14, further comprising:
receiving user input in response to a determination that user intervention is required.

16. The method according to claim 15, wherein the step of manipulating one or more objects comprises implementing the user input to manipulate the one or more objects.

17. The method according to claim 16, wherein the step of implementing the user input comprises manipulating the robotic device remotely by the user.

18. The method according to claim 14, wherein said step of determining whether user intervention is required comprises determining that user intervention is not required in response the robotic device determining a required manipulation.

19. The method according to claim 13, wherein the robotic device includes a manipulator, and
wherein said step of manipulating one or more objects comprises manipulating the one or more objects with the manipulator.

20. The method according to claim 13, wherein the robotic device includes a camera, and
wherein the step of detecting the one or more conditions comprises imaging an area of the data center with the camera.

21. The method according to claim 20, further comprising:
implementing image recognition software to identify one or more objects located in the images obtained by the camera.

22. The method according to claim 13, wherein the step of detecting one or more conditions comprises detecting temperature measurements, and wherein the step of determining whether the detected one or more conditions are within respective norms comprises comparing the detected one or more conditions with predetermined temperature values.

23. The method according to claim 22, wherein the robotic device includes a manipulator, the method further comprising:
manipulating one or more cooling system components in response to the detected temperature measurements being outside their respective norms.

24. The method according to claim 23, wherein said step of manipulating the one or more cooling system components comprises manipulating at least one of a vent, a louver, and an angled panel.

25. A robotic device for perforating operations in a data center, said robotic device comprising:
a body having a plurality of wheels;
a steering and propelling mechanism located on the body to control rotation and direction of the plurality of wheels;
at least one sensor for detecting one or more conditions in to data center, said one or more conditions comprising at least one of gas, smoke, noise, temperature, pressure, humidity, and airflow velocity;
an arm assembly rotatably attached to the body;
a manipulator assembly rotatably attached to a free end of the arm assembly,
a plurality of actuators for manipulating the arm assembly and the manipulator assembly;
a controller configured to control to plurality of actuators to manipulate the arm assembly and the manipulator assembly into various positions, wherein the controller is further configured to operate the plurality of actuators to perform operations in the data center.

26. The robotic device according to claim 25, further comprising:
a camera configured to image various sections of the data center where the manipulator assembly is performing operations.

27. The robotic device according to claim 26, wherein said camera is configured to detect one or more conditions in the data center, said one or more conditions comprising at least one of malfunctioning servers, blocked vents, and misplaced objects.

28. The robotic device according to claim 26, wherein said camera comprises at least one of a digital camera and an infrared camera.

29. The robotic device according to claim 25, further comprising;
a network adapter configured to enable communication to one or more computers through a network.

30. The robotic device according to claim 25, further comprising:
a guidance sensor for detecting objects in front of the robotic device, said guidance sensor comprising at least one of a camera and a laser.

31. The robotic device according to claim 25, wherein said robotic device is specifically designed for a data center in which said robotic device is configured for deployment.

32. A system fur operating a data center with a robotic device, sold system comprising:
means for detecting one or more conditions in the data center, wherein the one or more conditions comprise at least one of gas, smoke, noise, temperature, pressure, humidity, airflow velocity, server performance, and vent impedance;
means for determining whether the one or more conditions are within respective norms;
means for determining one or more manipulations to objects to bring the one or more conditions to within the respective norms; and
means for manipulating the objects with the robotic device.

33. The system according to claim 32, further comprising:
means for determining whether user intervention is required.

34. The system according to claim 33, further comprising:
means for manipulating one or more cooling system components.

35. A computer readable storage medium on which is embedded one or more computer programs, said one or more computer programs implementing a method for operating a data center with a robotic device, said one or more computer programs comprising a set of instructions for:
detecting a condition in a location of the data center, wherein the condition comprises at least one of gas, smoke, noise, temperature, pressure, humidity, airflow velocity, server performance, and vent impedance;
maneuvering the robotic device to travel to the location of the detected condition in the data center, wherein the robotic device comprises a camera and a manipulator;
imaging the location of the detected condition in the data center with the camera of the robotic device; and
manipulating an object with the manipulator of the robotic device.

36. The computer readable storage medium according to claim 35, said one or more computer programs further comprising a set of instructions for:
determining a route for the robotic device from a current position to a position near the location.

37. The computer readable storage medium according to claim 36, said one or more computer programs further comprising a set of instructions for:
determining a shortest route from the current position to the position near the location.

38. The computer readable storage medium according to claim 35, said one or more computer programs further comprising a set of instructions for:
detecting the condition with sensor positioned substantially near the location of the data center; and
transmitting the condition detected with the sensor positioned substantially near the location of the detected condition to the robotic device.

39. The computer readable storage medium according to claim 35, said one or more computer programs further comprising a set of instructions for:
detecting a malfunctioning server; and
depressing a power switch of the malfunctioning server with the manipulator of the robotic device.

40. The computer readable storage medium according to claim 35, said one or more computer programs further comprising a set of instructions for:
detecting an object impeding airflow through a vent; and
moving said object with the manipulator of the robotic device.

41. The computer readable storage medium according to claim 35, said one or more computer programs further comprising a set of instructions for:
sounding an alarm located on the robotic device in response to the detected condition.

* * * * *

UNITED STATES PATENT AND TRADEMARK OFFICE
CERTIFICATE OF CORRECTION

PATENT NO. : 7,072,739 B2
APPLICATION NO. : 10/446867
DATED : July 4, 2006
INVENTOR(S) : Cullen E. Bash et al.

It is certified that error appears in the above-identified patent and that said Letters Patent is hereby corrected as shown below:

In column 8, line 59, after "top of a vent" delete "1116" and insert -- 116 --, therefor.

In column 18, line 53, after "vent" delete "16" and insert -- 116 --, therefor.

In column 20, line 50, in Claim 1, delete "to" and insert -- the --, therefor.

In column 21, line 10, in Claim 8, after "wherein" delete "to" and insert -- the --, therefor.

In column 21, line 24, in Claim 11, delete "to" and insert -- the --, therefor.

In column 21, line 30, in Claim 12, delete "center, maneuvering to" and insert -- center; maneuvering the --, therefor.

In column 21, line 31, in Claim 12, after "location of" delete "to" and insert -- the --, therefor.

In column 21, line 32, in Claim 12, after "switch of" delete "to" and insert -- the --, therefor.

In column 22, line 37, in Claim 25, delete "perforating" and insert -- performing --, therefor.

In column 22, line 44, in Claim 25, delete "to" and insert -- the --, therefor.

In column 22, line 53, in Claim 25, delete "to" and insert -- the --, therefor.

In column 23, line 5, in Claim 29, delete "comprising;" and insert -- comprising: --, therefor.

In column 23, line 16, in Claim 32, delete "fur" and insert -- for --, therefor.

In column 23, line 17, in Claim 32, delete "sold" and insert -- said --, therefor.

UNITED STATES PATENT AND TRADEMARK OFFICE
CERTIFICATE OF CORRECTION

PATENT NO. : 7,072,739 B2
APPLICATION NO. : 10/446867
DATED : July 4, 2006
INVENTOR(S) : Cullen E. Bash et al.

It is certified that error appears in the above-identified patent and that said Letters Patent is hereby corrected as shown below:

In column 24, line 21, in Claim 38, after "with" insert -- a --.

Signed and Sealed this

Twenty-second Day of December, 2009

David J. Kappos
*Director of the United States Patent and Trademark Office*